United States Patent [19]

Zimlich

[11] Patent Number: 5,894,235

[45] Date of Patent: Apr. 13, 1999

[54] HIGH SPEED DATA SAMPLING SYSTEM

[75] Inventor: David A. Zimlich, Boise, Id.

[73] Assignee: Micron Technology, Inc., Boise, Id.

[21] Appl. No.: 08/936,775

[22] Filed: Sep. 24, 1997

Related U.S. Application Data

[63] Continuation of application No. 08/565,382, Nov. 30, 1995, abandoned.

[51] Int. Cl.$^6$ .............................. G11C 27/02; G09G 3/36
[52] U.S. Cl. ..................... 327/91; 327/100; 327/197
[58] Field of Search ............................. 327/91, 94, 115, 327/120, 258, 241, 238, 242, 254, 232; 377/54, 75, 47; 345/197, 198, 100, 98

[56] References Cited

U.S. PATENT DOCUMENTS

| | | | |
|---|---|---|---|
| 3,944,999 | 3/1976 | Moore | 345/197 |
| 3,982,063 | 9/1976 | Brown et al. | 345/197 |
| 4,099,258 | 7/1978 | Parsons | 345/197 |
| 4,208,723 | 6/1980 | Lecklider | 345/198 |
| 4,851,834 | 7/1989 | Stockebrand et al. | 345/198 |
| 5,111,072 | 5/1992 | Seidel | 327/94 |
| 5,142,494 | 8/1992 | D'Luna | 345/197 |
| 5,226,063 | 7/1993 | Higashitsutsumi | 377/54 |
| 5,369,417 | 11/1994 | Tanaka | 345/98 |
| 5,384,496 | 1/1995 | Tanaka | 327/94 |
| 5,416,432 | 5/1995 | Lewis et al. | 327/94 |
| 5,440,605 | 8/1995 | Shou et al. | 377/47 |
| 5,510,805 | 4/1996 | Lee | 345/197 |
| 5,512,846 | 4/1996 | Hori | 377/54 |

FOREIGN PATENT DOCUMENTS

| | | |
|---|---|---|
| 0 131 260 A2 | 1/1985 | European Pat. Off. . |
| 0 212 766 A2 | 3/1987 | European Pat. Off. . |
| 0 553 823 A2 | 8/1993 | European Pat. Off. . |
| 03001782 | 1/1991 | Japan . |
| 03224374 | 10/1991 | Japan . |
| 06342272 | 12/1994 | Japan . |
| WO 93/23937 | 11/1993 | WIPO . |

*Primary Examiner*—Timothy P. Callahan
*Assistant Examiner*—My-Trang Nu Ton
*Attorney, Agent, or Firm*—Seed and Berry LLP

[57] ABSTRACT

A system for sampling an analog or digital data signal at a relatively high rate utilizing relatively slow circuitry. The system includes several sample and hold circuits, each of which receive the data signal. The sample and hold circuits are clocked by respective clock signals that are at the same frequency but equally phased apart from each other. Thus, the sample and hold circuits take samples of the data signal at times that are equally spaced apart from each other. Each of the sample and hold circuits is connected to a series of shift registers that are clocked at the same frequency as the clock used to clock the sample and hold circuit to which they are connected. The shift registers operate to sequentially store samples obtained by their respective sample and hold circuit. The output of the shift registers may be applied to the column drivers of a conventional matrix display.

20 Claims, 9 Drawing Sheets

HIGH SPEED DATA SAMPLING SYSTEM

CROSS-REFERENCE TO RELATED APPLICATION

This application is a continuation of U.S. patent application Ser. No. 08/565,382, filed Nov. 30, 1995, now abandoned.

TECHNICAL FIELD

This invention relates to systems for sampling analog or digital data, and more particularly to a system for sampling analog or digital data at a high rate of speed, saving the samples, and then simultaneously outputting the samples for use by a matrix display or other device.

BACKGROUND OF THE INVENTION

It is often necessary to sample analog or digital data in a variety of fields. Generally, an analog or digital signal containing data is sampled at a periodic rate to obtain samples corresponding to the amplitude of the signal at equally spaced apart points in time. These samples are then processed, such as by saving the samples for future use. In some instances, the samples are processed sequentially after they have been saved, and in other situations the samples are processed simultaneously after they have been saved.

One example of a prior art sampling system in which a signal containing analog or digital data is sampled and then simultaneously processed is in drive circuits for matrix displays, such as field emission displays. Matrix displays are typically arranged in a array of rows and columns which are perpendicular to each other on a display screen. Generally, each row is sequentially selected, and each column in the selected row is then modulated to control the intensity of a corresponding pixel located at the intersection of the selected row and the corresponding column. Thus, for example, 500 equally spaced samples of a video signal may be obtained and used to modulate 500 respective columns of a N×500 matrix display. The first sample of the video signal is used to control the intensity of the leftmost pixel in the selected row while the last sample of the video signal is used to control the intensity of the rightmost pixel in the selected row.

One type of sampling system 10 that can be used to obtain samples of a video signal is illustrated in FIG. 1. The system 10 of FIG. 1 includes a sample and hold circuit 12 having an input line 13, an output line 14 and a clock input line 16. An analog or digital data signal is applied to the input line 13. The sample and hold circuit 12 outputs a sample of the data signal on line 14 for each leading edge of a clock signal 100 applied to the clock input line 16. The samples on line 14 are applied to a series of shift registers 20–28. The shift registers 20–28 each have a clock input line 30 that is simultaneously driven by the same clock signal $\phi$ that drives the sample and hold circuit 12 through line 16. The shift registers each have an input line 32 and an output line 34. The sampling circuit 10 operates as described below to simultaneously output on the output lines 34 respective samples $S_1, S_2, S_3 \ldots S_{N-1}$ and $S_N$ of the data signal applied to the input line 13 of the sample and hold circuit 12.

The operation of the sampling circuit shown in FIG. 1 is best explained with reference to FIG. 2. The upper portion of FIG. 2 shows an analog data signal while the lower portion of FIG. 2 shows the clock signal $\phi$. As illustrated in FIG. 2, the clock signal has a frequency of 100 MHz, corresponding to a clock period of 10 nanoseconds. As explained above, the sample and hold circuit 12 takes a sample of the data signal on each leading edge of the clock signal $\phi$. Thus, the sample and hold circuit 12 samples the data input signal at times $t_1, t_2, t_3 \ldots t_{N-1}$ and $t_n$. The sample $S_1$ taken at time $t_1$ is first shifted into the first shift register 20. At time $t_2$, the first sample $S_1$ is shifted into the second shift register 22 while the second sample $S_2$ is shifted into the first shift register 20. The sampling circuit 10 continues to operate in that manner until the first sample $S_1$ taken at time $t_1$ has been shifted to the last shift register 28. At that time, sample $S_1$ is being output from the shift register 28, the second sample $S_2$ is being output from the N–1 shift register 26, the third sample $S_3$ is being output from the N–2 shift register 24, the second to last sample is being output from the second shift register 22, and the last sample $S_N$ is being output from the first shift register 20. The samples $S_1$–$S_N$ can then be used to drive the columns of a matrix display so that the left pixel of a selected row of the display will have an intensity corresponding to the amplitude of the data signal at time $\tau_1$. Similarly, the night pixel of the selected row of the display will have an intensity corresponding to the amplitude of the data signal at time $t_N$. The intensity of the pixels between the end pixels of the selected row will have intensities corresponding to the amplitude of the data signal at points in time corresponding to their location in the selected row. The sampling circuit 10 can, of course, be used for a wide variety of purposes other than to drive matrix displays.

The prior art approach illustrated in FIGS. 1 and 2 generally has worked satisfactorily up until the present. However, data signals, such as the data signals illustrated at the top of FIG. 2, are more frequently being displayed on matrix displays having a higher resolution. These higher resolution displays have a higher resolution because there is a larger number of columns in the matrix array. As explained above, a sample of the data signal must be obtained for each column of the matrix display. Therefore, higher resolution matrix displays require that the data be sampled at a correspondingly higher rate. For example, the "refresh rate," i. e., the rate at which all of the pixels in a display are modulated, is commonly 60 Hz. A conventional VGA display has 480 lines and 640 columns. Thus, 480 rows must be processed 60 times each second so that the time required to process each row is 34.7 microseconds (i.e., the reciprocal of 60*480). During that 34.7 microseconds, 640 samples of the data signal must be taken, resulting in a sample rate of about 54 nanoseconds. The approach illustrated in FIGS. 1 and 2 has generally been capable of providing samples at that rate. However, higher resolution XGA displays have 768 rows and 1024 columns. With a 60 Hz refresh rate, each row must be processed in a time of 21.7 microseconds. In that 21.7 microseconds, 1024 samples must be taken, resulting in a sample rate of 21.2 nanoseconds. It is currently not economically feasible to use the approach illustrated in FIGS. 1 and 2 to sample at this higher rate. Moreover, the resolution of matrix displays continues to increase so that it is likely that even higher sample rates will be required in the future. The conventional approach to sampling data signals to drive matrix displays is thus not suitable for modern high resolution matrix displays.

SUMMARY OF THE INVENTION

The inventive system and method samples an analog or digital data signal at a relatively high frequency using components that operate at a relatively low frequency. The system includes a clock circuit generating a plurality of clock signals at respective outputs having phases that differ from each other. Although these phases differences need not be uniform, it is preferred that the clock signals have phases that are uniformly spaced from each other. If so, the clock signals have respective phases of 360/X degrees, where X=1, 2, ... N, and N is the number of clock signals generated by the clock circuit. The sampling system also includes a plurality of sample circuits each of which has a data input receiving the data signal and a clock input receiving a respective one of the clock signals. Each of the sample circuits samples the data signal responsive to its respective clock signal and applies the sample to an output. The sampling system also includes a plurality of sets of shift registers each of which has a data input, a data output, and a clock input. The shift registers in each set are connected in series, and the first shift register in each set has its input connected to the output of a respective sample circuit. The clock inputs of all of the shift registers in each set are coupled to each other and to one of the clock signals so that the shift registers operate in unison. In the event that the data signal is an analog signal, the sample circuit and the shift registers are analog devices. In the event that the data signal is a digital signal, digital sampling circuits and shift registers may be used. If the frequency of the clock signals is $f_0$, then the data signal is sampled at the relatively high frequency of $Nf_0$. Thus, for a given sampling frequency, the operating frequency of the system components can be reduced as desired by increasing N. i. e., the number of sample and hold circuits. Although the inventive sampling system and method can be used for a variety of purposes, it may advantageously be used to generate column modulating signals for a conventional matrix display having a plurality of row inputs and a plurality of column inputs.

DETAILED DESCRIPTION OF THE INVENTION

Figure 1:
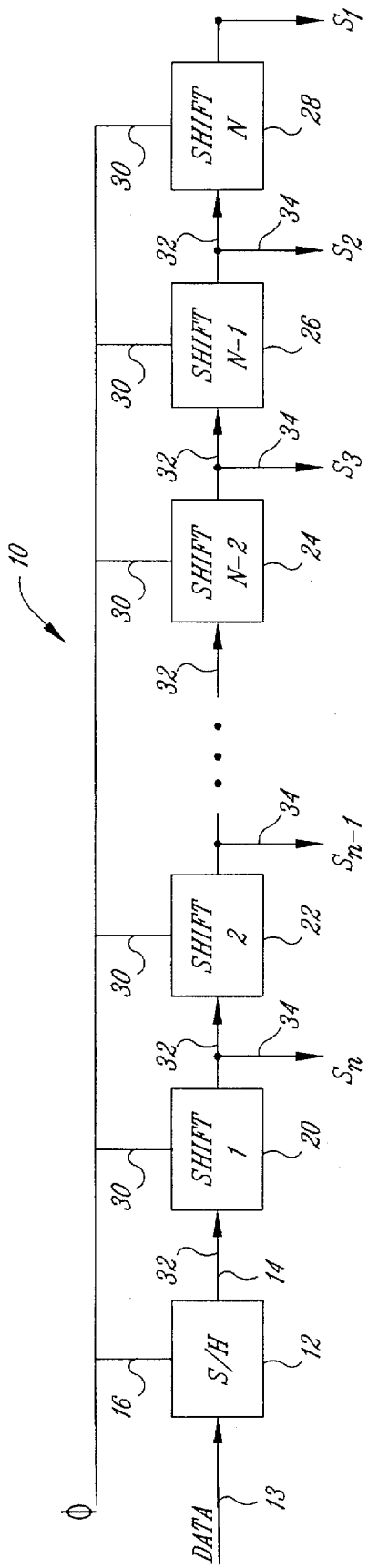
FIG. 1 is a block diagram showing a prior art system for obtaining and storing samples of a data signal.
Figure 2:
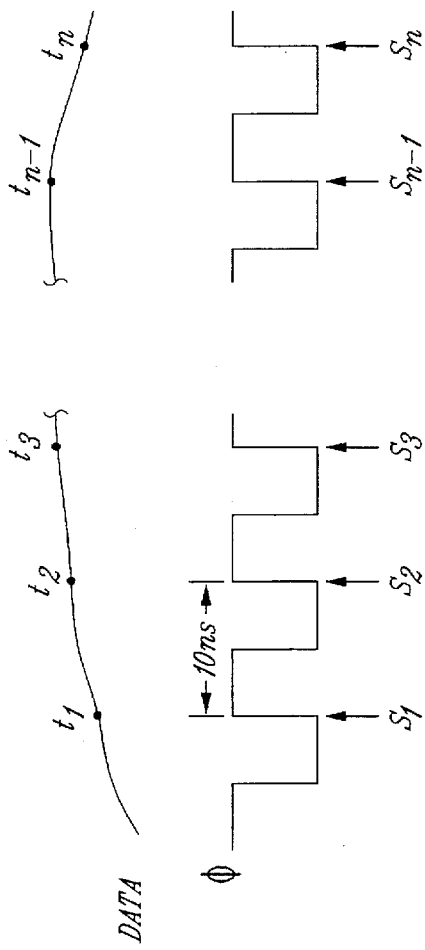
FIG. 2 is a waveform and timing diagram used to explain the operation of the system of FIG. 1.
Figure 3:
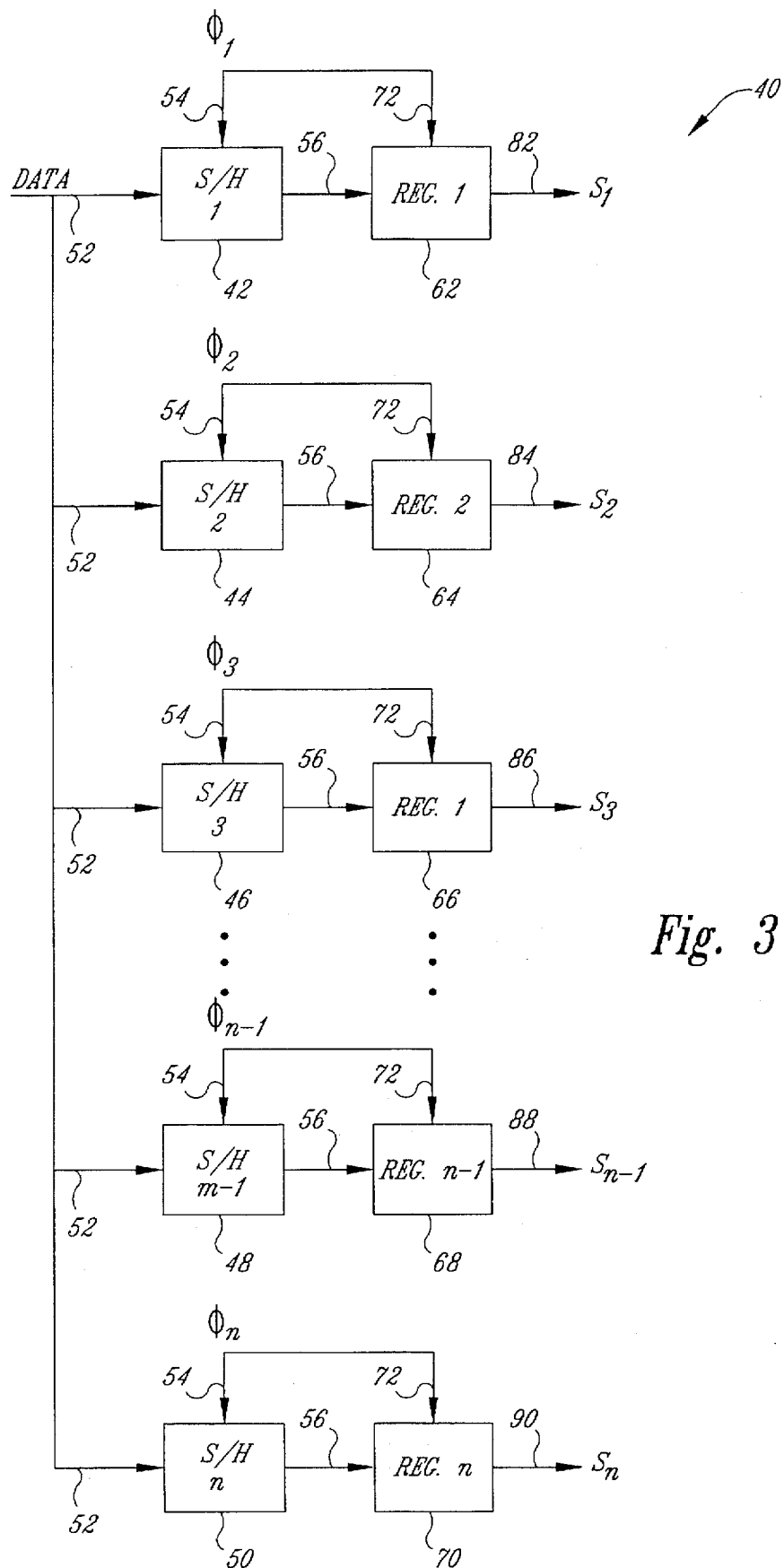
FIG. 3 is a block diagram used to explain the principle of operation of the inventive sampling system.
Figure 4:
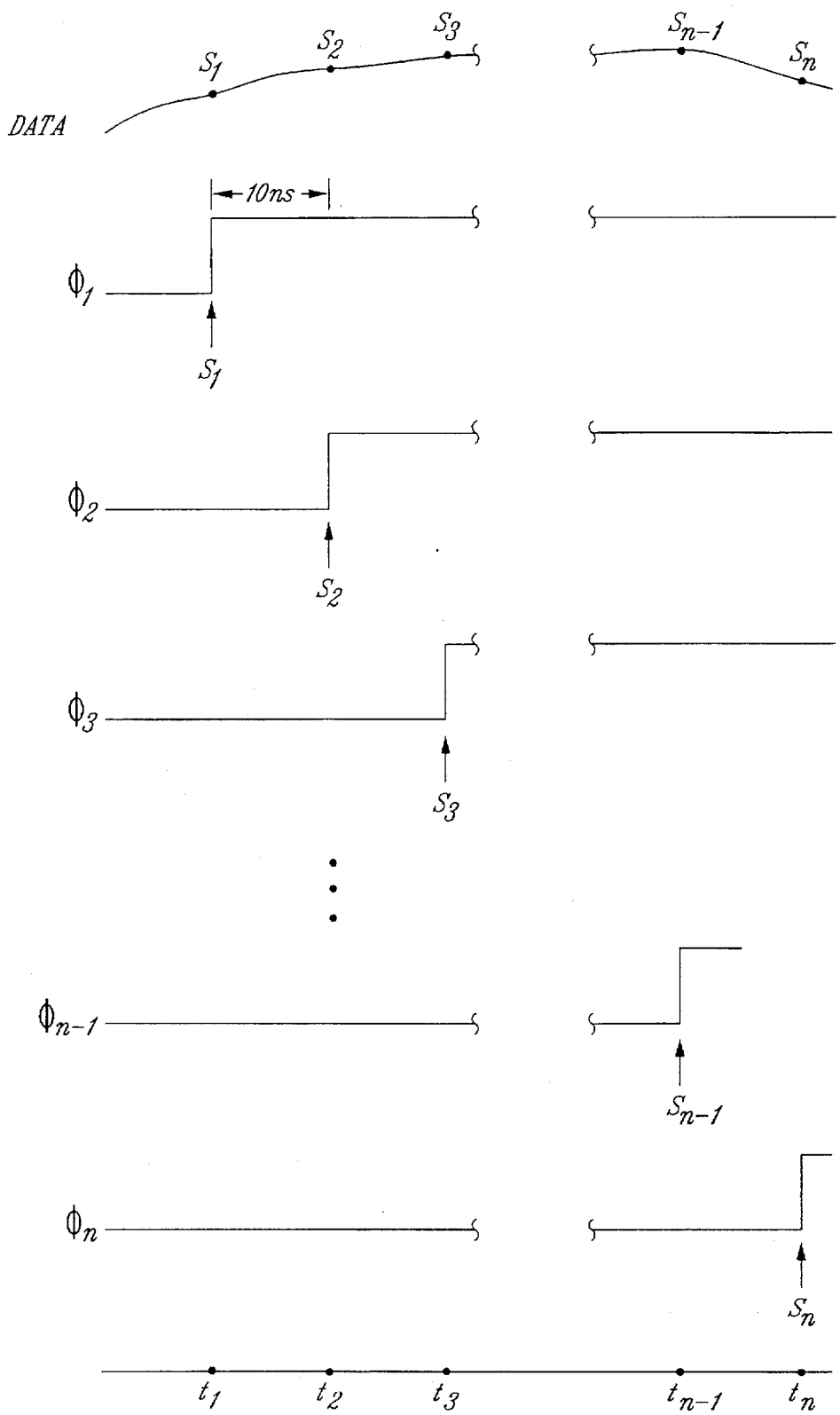
FIG. 4 is a waveform and timing diagram used to explain the operation of the system of FIG. 3.

The principle of operation of the inventive sampling system can best be explained with reference to FIGS. 3 and 4. As shown in FIG. 3, a sampling system 40 includes several sample and hold circuits 42–50 which are labeled $S/H_1$, $S/H_2$ ... $S/H_N$. Each of the sample and hold circuits 42–50 are identical to each other, and they are of the type used as the sample and hold circuit of FIG. 1. All of the sample and hold circuits 42–50 receive on respective data input lines 52 a data signal shown at the top of FIG. 4. The sample and hold circuits 42–50 receives on respective clock input lines 54 clock signals $\phi_1$, $\phi_2$ ... $\phi_N$ which are equally phased apart from each other. Thus, the phase of clock signal $\phi_2$ differs from the phase of clock signal $\phi_1$ by 360°/N. Each of the clock signals are shown in FIG. 4. Outputs from the sample and hold circuits 42–50 are applied through output lines 56 to the inputs of respective registers 62–70 which also receive at respective clock input lines 72 the corresponding clock signal $\phi_1$–$\phi_N$. Each of the registers 62–70 outputs on a respective output line 82–90 a sample $S_1$–$S_N$.

As shown in FIG. 4, each of the sample and hold circuits 42–50 samples the data signal on the leading edge of its respective clock signal $\phi_1$–$\phi_n$. The clock signal also latches the sample to the output of the respective register 62–70. Thus, at time $\tau_1$, the rising edge of the first clock $\phi_1$ causes the sample and hold circuit 42 to take a sample $S_1$ of the data signal, and it also causes the register 62 to output that sample on output line 82. Similarly, at time $\tau_2$, the rising edge of the second clock $\phi_2$ causes the sample and hold circuit 44 to take a second sample $S_2$ of the data signal. The second clock signal $\phi_2$ also triggers the register 64 to present that sample $S_2$ to the output line 84. The operation continues as explained above until the clock signal $\phi_N$ causes the sample and hold circuit $S/H_N$ 50 to take a sample at time $\tau_N$. The clock $\phi_N$ also triggers the register 70 to output that sample $S_N$ on the output line 90. At this time, all of the samples $S_1$, $S_2$ ... $S_N$ are present on the respective output lines 82–90.

What is significant about the operation of the system shown in FIG. 3 is that the data signal is sampled at 10 nanosecond intervals, even though all of the registers 62–70 operate at a frequency that is substantially lower than a 10 nanosecond sampling rate (i.e., 100 MHz). For a sampling system having N sample and hold circuits, the data can be continuously sampled at a frequency of $f_0/N$, where $f_0$ is the sampling frequency (100 MHz in the above example). Thus, for example, a sampling system having 5 sample and hold circuits can sample the data signal at a rate of 100 MHz even though the components of the system operate at only a frequency of 20 MHz.

Figure 5:
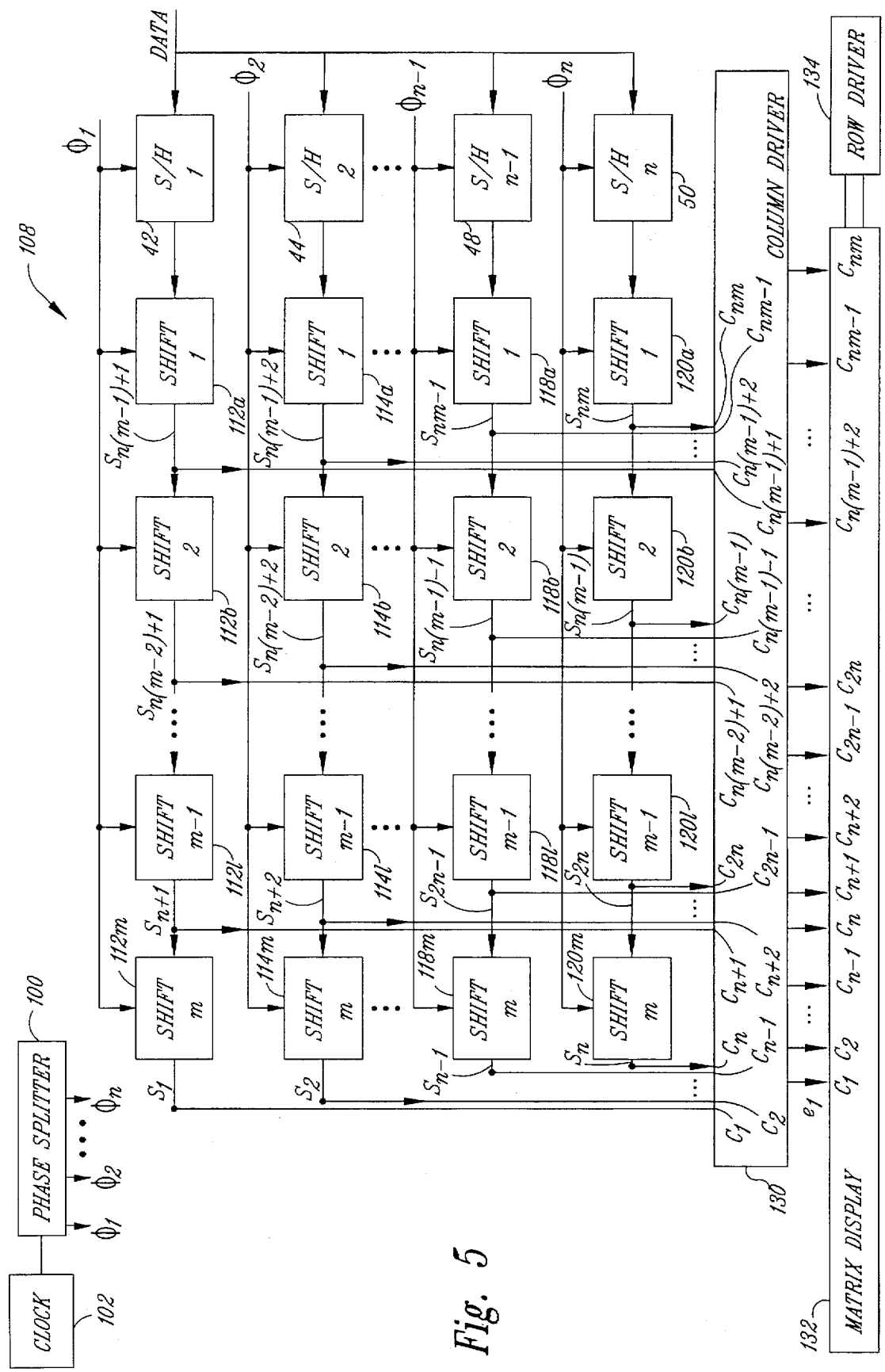
FIG. 5 is a generalized block diagram of one embodiment of the inventive sampling system.

The importance of being able to sample at a relatively high frequency using circuitry operating at a relatively low frequency is more apparent in the generalized block diagram of one embodiment of the inventive sampling system 108 used to drive the columns of a matrix display. With reference to FIG. 5, the sampling system includes N sample and hold circuits which are identical to the sample and hold circuits 42–50 of FIG. 3, and are thus identically numbered. Each of the sample and hold circuits 42–50 are triggered by a respective clock signal $\phi_1$, $\phi_2$ ... $\phi_N$. The clocks signals $\phi_1$–$\phi_N$ are generated by a conventional phase splitter 100 from a master clock signal generated by a conventional clock circuit 102. As is well known to one skilled in the art, the phase splitter 100 can be implemented using a variety of circuitry including a conventional counter and decoder. Where the sampling system 108 is fabricated on a single integrated circuit, the clock circuit 102 and/or phase splitter are preferably but not necessarily located off of the integrated circuit. The clock signals $\phi_1$, $\phi_2$ ... $\phi_N$ preferably have a frequency equaal to the ratio of the frequency of the master clock signal from the clock circuit 102 to the number of clock signals N. The phases of the clock signals $\phi_1, \phi_2 \ldots \phi_N$ are preferably equally spaced apart from each other.

The sample at the output of each sample and hold circuit 42–50 is applied to M series connected shift registers 112–120. Each of the shift registers in each series 112, 114, 116 or 120 are clocked by the same clock signal, i.e., a respective clock signal from the phase splitter 100. Thus, for example, the shift registers 112a–m are all clocked by the $\phi_1$ clock signal. Similarly, the last set of shift registers 120a–m are all clocked by the $\phi_N$ clock.

As explained in greater detail below, the outputs of all of the shift registers 112a–120m are applied to respective inputs of a conventional column driver circuit 130. The column driver circuit 130 generates appropriate column driver signals that are applied to respective column inputs of a matrix display 132, such as a field emission display. As is well known in the art, the matrix display 132 also receives row input signals from a conventional row driver circuit 134.

Figure 6:
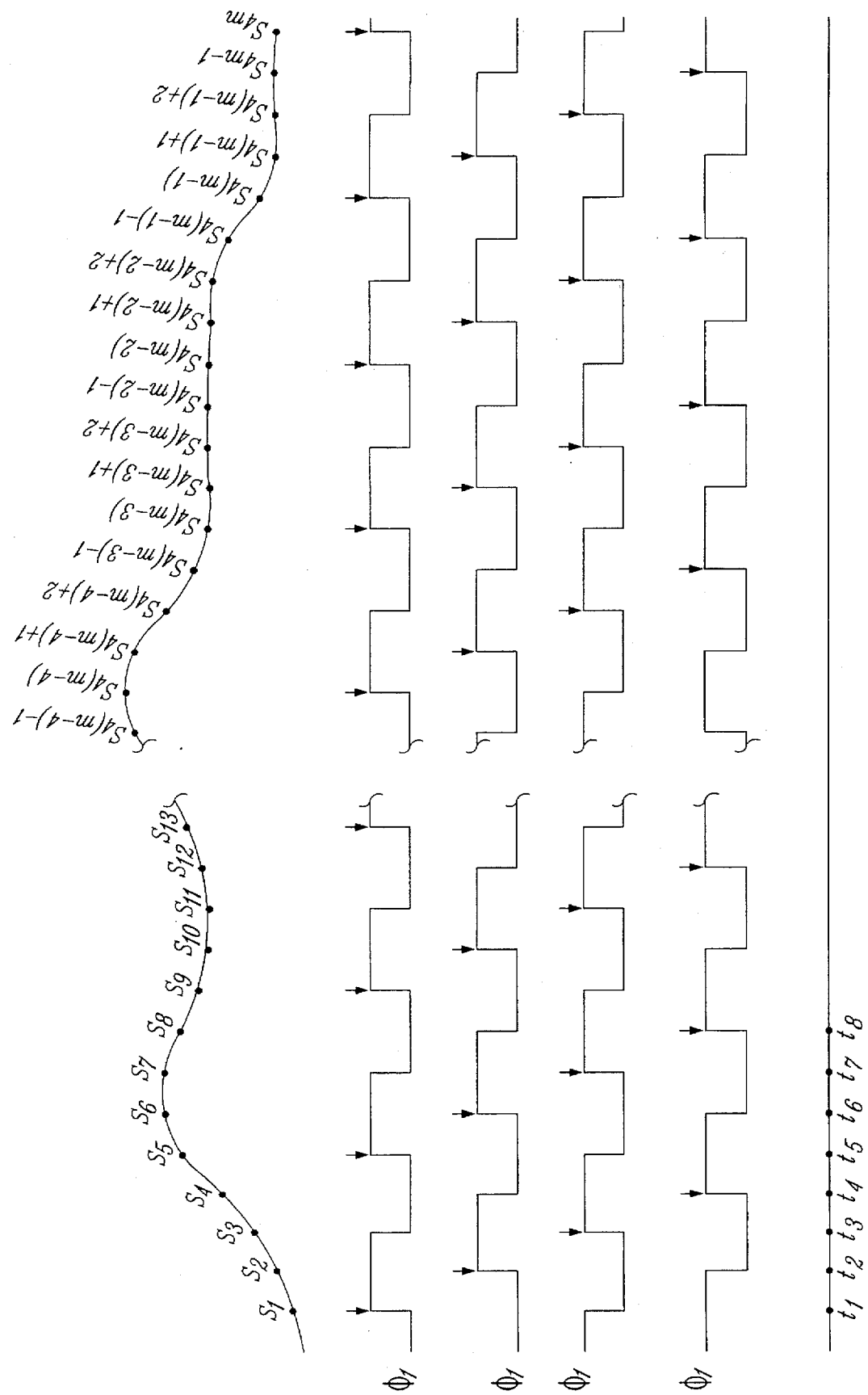
FIG. 6 is a waveform and timing diagram showing the operation of the system of FIG. 5 having a 4*M matrix display.

The operation of the sampling system 108 shown in FIG. 5 is best explained with reference to FIG. 6. The data signal is shown in FIG. 6 as an analog data signal, although it will be understood that the signal may also be a digital data signal having either of two input levels. The operation of the sampling system shown in FIG. 5 is explained with reference to FIG. 6 in which the number "N" in the generalized block diagram of FIG. 5 is 4 (i.e., there are 4 sample and hold circuits 42–50). At time $\tau_1$, the first clock signal $\phi_1$ triggers the sample and hold circuit 42 to take a first sample $S_1$. The first clock signal $\phi_1$ also shifts the sample to the output of the first shift register 112a. At time $\tau_2$, the second clock signal $\phi_2$ causes the second sample and hold circuit 44 to sample the data signal and shift that sample $S_2$ to the output of the first register 114a in the second set. The operation proceeds in that manner until the last clock signal $\phi_N$ causes the fourth (N=4) sample and hold circuit 50 to sample the data signal at time $\tau_4$ and shift the sample $S_4$ to the output of the first shift register 120a in that set. At time $\tau_5$, the clock $\phi_1$ causes the second sample and hold circuit 112b to shift the first sample $S_1$ from the output of the first shift register 112a to the output of the second shift register 112b. The clock signal $\phi_1$ at time $\tau_5$ also causes the sample and hold circuit 42 to once again sample the data signal to obtain a sample $S_5$, and shift that sample $S_5$ to the output of the shift register 112a. (In practice, data is shifted into and out of the shift registers 112–120 at different times but, for the purposes of clarity, the shift registers 112–120 are explained herein as being capable of shifting new data in and old data out at the same time.) Additional samples are taken by the second sample and hold circuit 44 at time $\tau_5$, and the third sample and hold circuit 48 at time $\tau_6$ until the fourth sample and hold circuit 50 once again samples the data signal at time $\tau_7$. Thereafter, the first sample and hold circuit 42 takes a third sample S9 at time $\tau_8$. At the same time, the $\phi_1$ clock signal shifts the first sample $S_1$ into the shift register downstream from the shift register 112b, shifts the sample $S_5$ into the second shift register 112b, and shifts the sample $S_9$ into the shift register 112a. The operation proceeds in that same manner until the first sample $S_1$ has been shifted to the M shift register 112m, and the fourth sample $S_4$, has been shifted to the shift register 120m. At that time, the fourth to last sample $S_{4(m-1)+1}$ has been shifted to the shift register 112a, the second to last sample $S_{4(M=1)+2}$ has been shifted to the second shift register 114a, etc., and the last sample $S_{4M}$ has been shifted to the shift register 120a. At this time, all of these samples $S_1$–$S_{4M}$ are processed by the column driver circuitry 130, which then applies the appropriate signals to the column signals of the matrix display 132. The display 132 then illuminates pixels with an intensity corresponding to the amplitude of the respective sample at a location corresponding to the overlap of the column and the row selected by the row driver circuit 134. Note that the first sample $S_1$ is applied to the leftmost column input of the column driver circuit 130, while the last signal $S_{NM}$ is applied to the rightmost column input of the column driver circuit 130. The samples are applied to the column driver circuit 130 in this order because, by convention, matrix displays receiving video signals generally display the initial portion of the video signal on the left hand side of the display screen, and the ending portion of the video signal on the right hand side of the display screen. It will be understood, however, that the order of displaying the samples can be reversed if desired.

It will be apparent from FIG. 6 that the clock signals $\phi_1$–$\phi_4$ have a frequency that is ¼ of the frequency at which the data signal is sampled, as explained above. Thus, even though the data signal is sampled at a relatively high rate, e.g., 100 MHz, the shift registers 112–120 can operate at a relatively low frequency, i.e., 25 MHz. By increasing the number of clock signals and sets of sample and hold and shift registers, the operating frequency of the shift registers 112–120 can be decreased even further without decreasing sampling frequency. For example, by utilizing 8 clock signals and 8 sets of sample and hold circuits 42–50 and shift registers 112–120, the data signal can be sampled at 100 MHz even though the shift registers are operating at 12.5 MHz.

Figure 7:
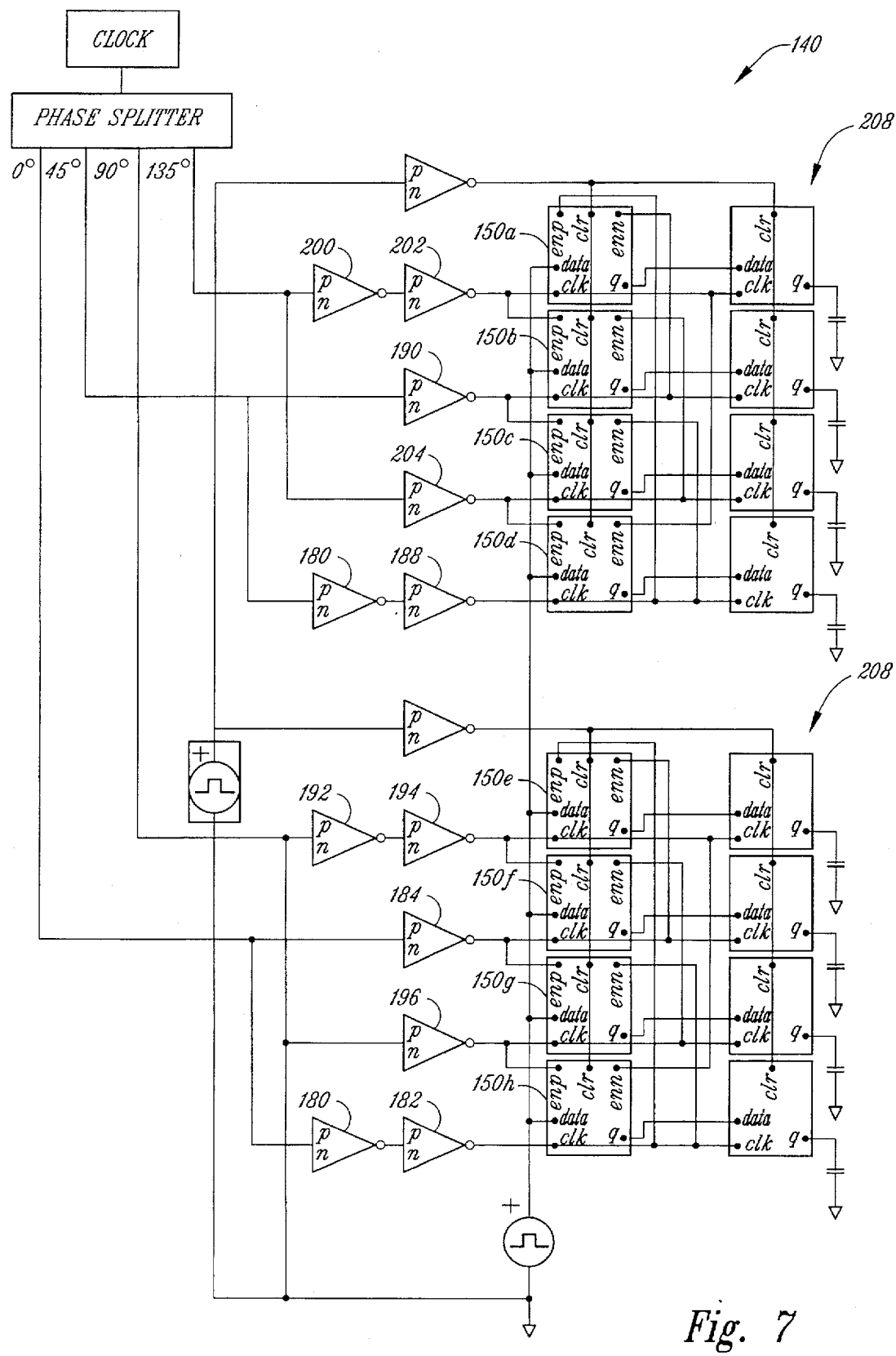
FIG. 7 is a logic diagram of one embodiment of the inventive system shown in FIG. 5.

One specific embodiment of the generalized sampling system 108 illustrated in FIG. 5 is shown in FIG. 7. Although the sampling system shown in FIG. 7 can be implemented to sample either analog or digital signals, the embodiment illustrated in FIG. 7 is used to sample digital signals. Like the system 108 shown in FIG. 5, the system 140 shown in FIG. 7 uses a phase splitter 100 to generate a series of clock signals from a master clock 102. These clock signals are phased at 0°, 45°, 90°, and 135°, with the remaining angles between 135° and 360° at 45° increments being generated by inverting the clock signals from the phase splitter 100, as explained below. The clock signals are applied to respective sampling circuits and shift registers, generally indicated at 150, through a set of inverters, generally indicated at 152. More specifically, the 0° clock signal from the phase splitter 100 is applied to a sampling and shift register circuit 150h through a pair of inverters 180, 182 so that the clock input of the circuit 150h is phased at 0°. The 0° clock signal from the phase splitter 100 is also applied to a sample and shift register circuit 150f through an inverter 184 so that the circuit 150f receives a clock signal phased at 180°. In a similar manner, the 45° clock signal from the phase splitter 100 is applied to a sampling and shift register circuit 150d through a pair of inverters 186, 188 so that the clock input of the sampling and shift register circuit 150d receives a 45° clock signal. The 45° clock signal is also applied to a register sampling and shift circuit 150b through a single inverter 190 so that the clock input of the sampling and shift register circuit 150b receives a clock signal phased at 225°. In a like manner, the 90° clock signal from the phase splitter 100 is applied to a sampling and shift register circuit 150e through a pair of inverters 192, 194 and to a sampling and shift register circuit 150g through a single inverter 196. Thus, the sampling and shift register circuit 150e receives a clock signal phased at 90° and the sampling and shift register circuit 150g receives a signal phased at 270°. Finally, the 135° clock signal from the phase splitter 100 is applied to a sampling and shift register circuit 150a through a pair of inverters 200, 202 and to a sampling and shift register circuit 150c through a single inverter 204. Thus, the sampling and shift register circuit 150a receives a clock signal phased at 135°, while the sampling and shift register circuit 150c receives a clock signal phased at 315°. In summary, the clock inputs of the sampling and shift register circuits 150a–h receive eight separate clock signals phased 45° apart from each other. The outputs of the sampling and shift register circuits 150 drive respective sets of series connected shift registers, generally indicated by reference numeral 208.

Figure 8:
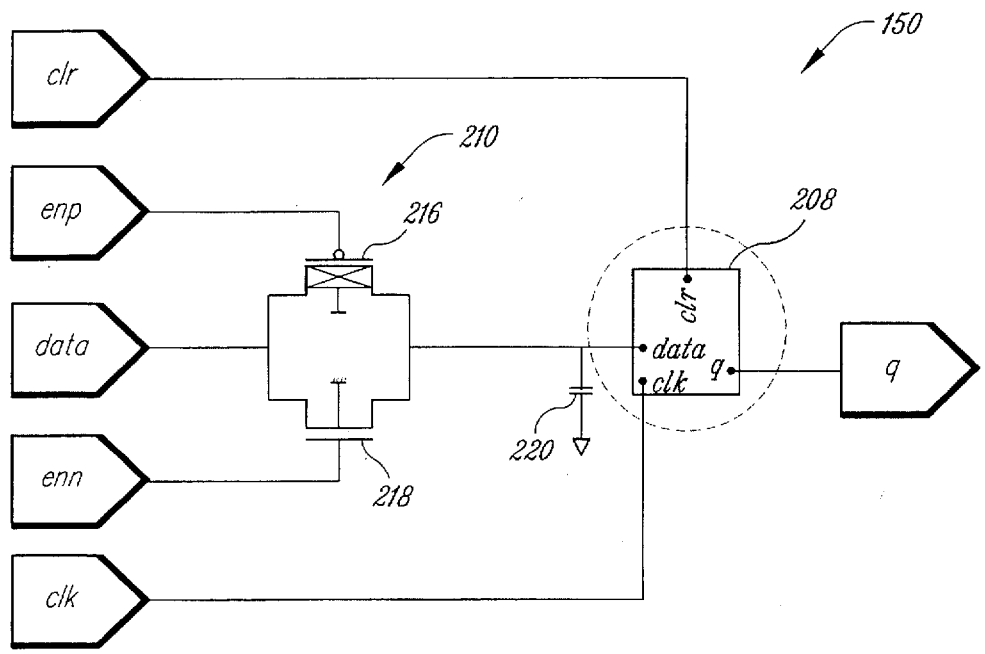
FIG. 8 is a schematic and logic diagram of a sample and hold circuit and shift register shown in the logic diagram of FIG. 7.

The sampling and shift register circuits 150a–h are shown in greater detail in FIG. 8. The circuits 150 include a sampling circuit 210 and the shift register circuit 208. The sampling circuit includes a PMOS transistor 216 and an NMOS transistor 218 connected in parallel with each other so that the sources of the transistors 216, 218 are both connected to the data signal input and the drains of the transistors 216, 218 are both connected to a common output. The gate of the PMOS transistor 216 is connected to a first enable input "enp" while the gate of the NMOS transistor 218 is connected to a second enable input "enn". The PMOS transistor 216 is switched to a conductive state by a logic "0" signal, while the NMOS transistor is switched to a conductive state by a logic "1" signal. When the transistors 216, 218 are switched to a non-conductive state, the amplitude of the data signal at that time is stored on a capacitor 220. The sample on the capacitor 220 is then applied to the data input of the shift register 208.

Figure 9:
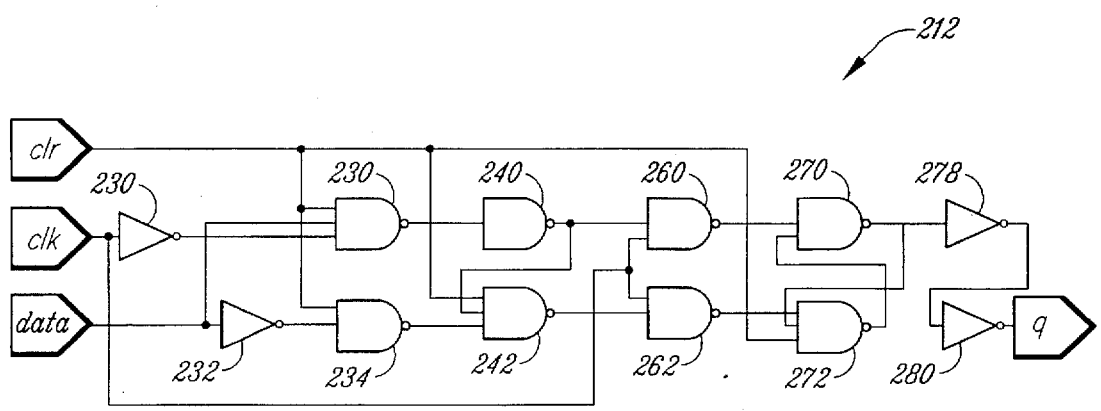
FIG. 9 is a detailed logic diagram of the shift register shown in the logic diagram of FIG. 8.

The shift registers 208 are illustrated in greater detail in FIG. 9. The data signal is applied directly to a first NAND gate 230) and through an inverter 232 to a second NAND gate 234. The clock signal is applied through an inverter 236 to the inputs of both the NAND gates 230, 234. Thus, the NAND gates 230, 234 are enabled on the trailing edge (i. e., high to low transition) of the clock input. If the data input is at logic "1" at that time, the logic "0" applied to the input of the NAND gate 234 sets a flip-flop formed by NAND gates 240, 242, thereby causing the NAND gate 242 to output a logic "1". At the same time, the NAND gate 240 outputs a logic "0" which holds the output of the NAND gate 242 at logic "1". If the data input is low at the falling edge of the clock signal, the flip-flop formed by the NAND gates 240, 242 is reset so that the NAND gate 240 outputs a logic "high" and the NAND gate 242 outputs a logic "0". Thus, the data sample is clocked into the shift register 208 on the falling edge of the clock signal.

The clock signal is also applied directly to a pair of NAND gates 260, 262 having their outputs connected to a pair of NAND gates 270, 272. The NAND gates 260, 262 function in the same manner as the NAND gates 230, 234, while the NAND gates 270, 272 function as a flip-flop in the same manner as the NAND gates 240, 242. Thus, the NAND gates 260, 262 are enabled on the rising edge (i.e., the "low to high transition" of the clock signal), thereby applying the inverse of the output from the NAND gates 240, 242 to the NAND gates 270, 272. If the data signal was logic "1" at the previous falling edge of the clock signal, the logic "0" at the output of the NAND gate 242 causes the output of the NAND gate 262 to go high at the rising edge of the clock signal. Conversely, the logic "1" at the output of the NAND gate 240 causes the NAND gate 260 to output a logic "0", thereby resetting the flip-flop formed by the NAND gates 270, 272. The NAND gate 270 outputs a logic "1" which, after being inverted twice by a pair of inverters 278, 280 is a log,ic "1". If the data signal was a logic "0" at the falling edge of the clock signal, a logic "0" is shifted out through the inverter 280 on the next rising edge of the clock signal.

In summary, data is shifted into the shift register on the falling, edge of the clock signal, and that same data is shifted out of the register on the subsequent rising edge of the clock signal.

Figure 10:
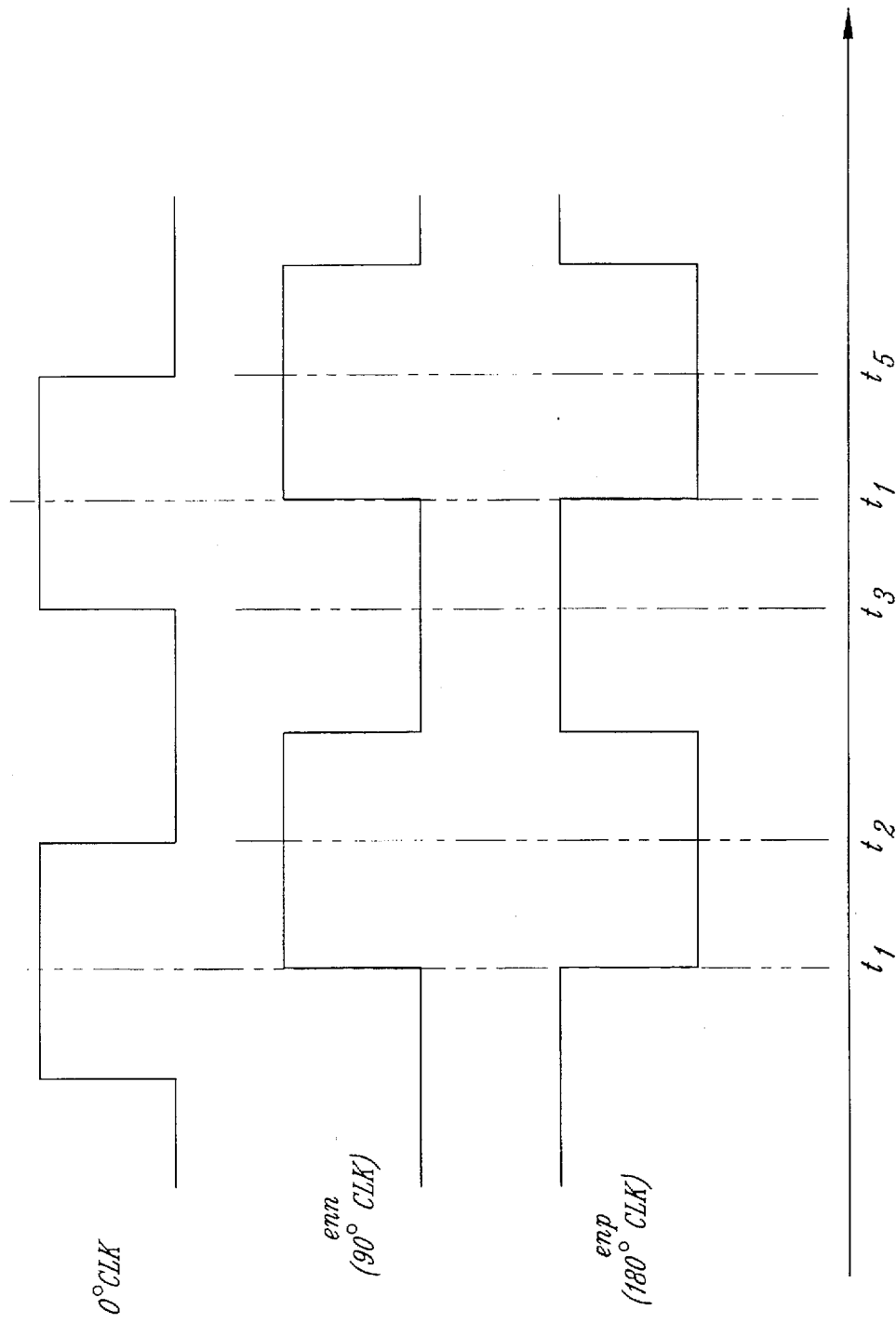
FIG. 10 is a timing diagram showing the operation of a portion of the components used in the embodiment of FIGS. 7-9.

The operation of the sampling circuits 140 shown in FIGS. 7–9 is best explained with reference to FIG. 10 for the register 150h which receives the 0° clock signal. The enn enable input to the circuit 150h receives the 90° clock signal while the enp enable input receives the inverse, i.e., the 270° clock signal. Thus, at time $\tau_1$, a sample of the data signal is taken and stored on the capacitor 220. Thereafter, on the trailing edge of the 0° clock at $\tau_2$, the sample stored on the capacitor 220 is latched into the shift register 208 in the circuit 158h. On the next leading edge of the 0° clock at time $\tau_3$, the data is latched to the output of the shift register 208 in the circuit 150h. At time $\tau_4$, another sample of the data signal is taken. At time $\tau_5$, the second sample taken at time $\tau_4$ is latched into the shift register 208 of the circuit 150h, while the first sample taken at time $\tau_1$ is latched into the second shift register 208. The operation of each set of shift registers 208 proceeds as described above until data has been shifted into the last shift register in the series.

Figure 11:
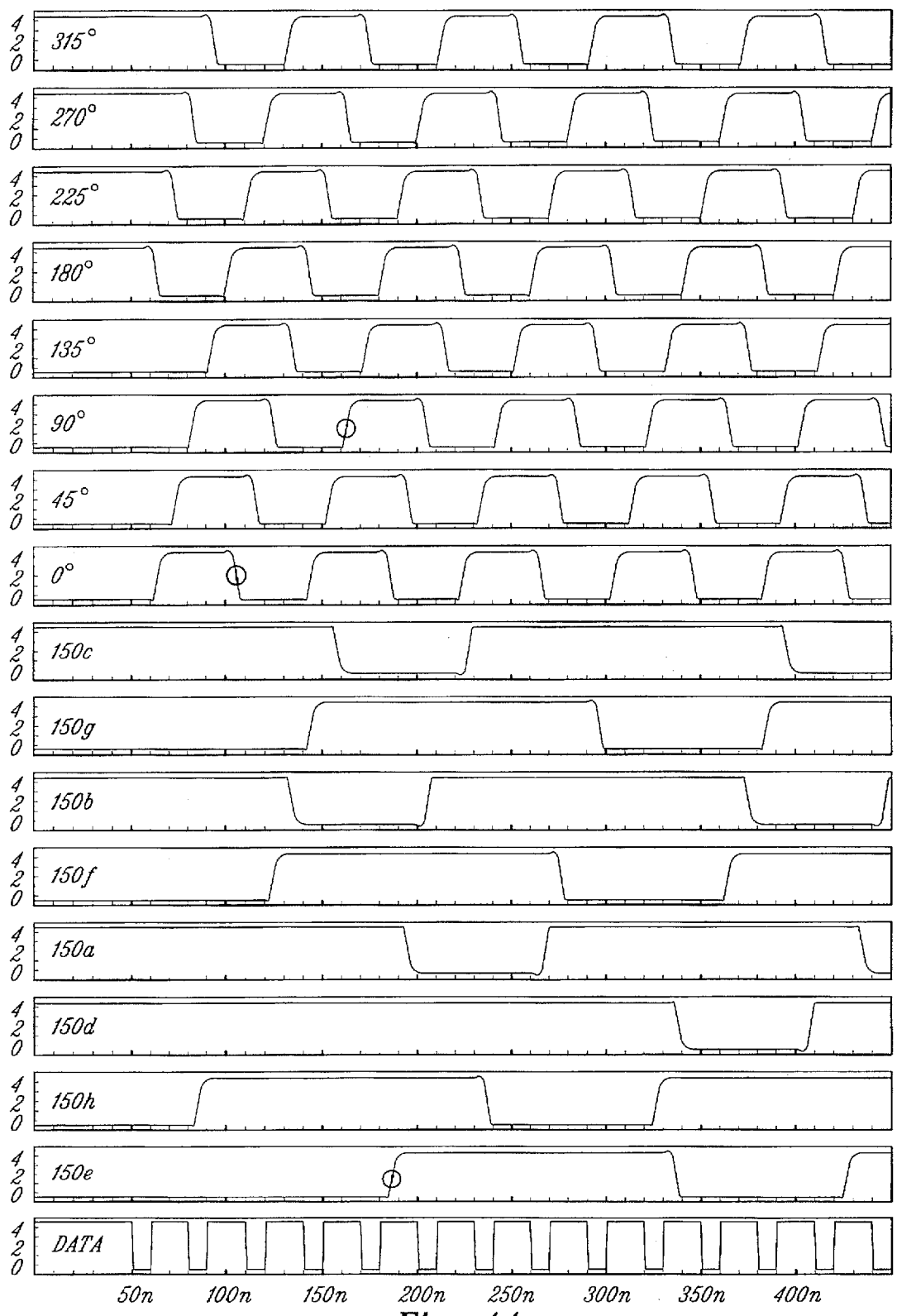
FIG. 11 is a timing diagram showing the operation of substantially all of the components used in the components.

The operation of all of the circuitry shown in FIG. 7 is shown in the timing diagram of FIG. 11. In addition to showing the clock signals, the timing diagram of FIG. 111 shows the digital data signal applied to the sampling and register circuits 150 as well as the data output from the first shift register 208 in the circuits 150. The signals output from the shift registers 208 are delayed from the rising edge of the clock signal because of the propagation signal delay through the shift registers 208.

It is thus seen that the inventive sampling system is able to sample analog or digital data at an extremely high rate of speed using relatively slow as well as sampling circuits that operate at a relatively low frequency. It will be appreciated that, although specific embodiments of the invention have been described herein for purposes of illustration, various modifications may be made without departing from the spirit and scope of the invention. For example, although the data signals are shown as being sampled by sample and hold circuits, it will be understood that other device, such as multiple memory devices enabled by respective clocks differing in phase from each other, may be used. In such case, instead of using shift registers to store a large number of samples, respective counters clocked by the differing phase clock signals can be used to address the memory to store each of the samples in sequential addresses. Accordingly, the invention is not limited except as by the appended claims.

I claim:

1. A system for sampling a data signal at a relatively high speed, said system comprising:

a clock circuit generating at an output a master clock signal;

a clock divider having an input connected to the output of said clock circuit to receive said master clock signal from said clock circuit, said clock divider generating from said master clock signal a plurality of clock signals at respective outputs having a frequency that is substantially lower than the frequency of said master clock signal said clock signals having respective phases that differ from each other;

a plurality of sample circuits each of which has a data input receiving said data signal and a clock input receiving a respective one of said clock signals, each of said sample circuits sampling said data signal responsive to its respective clock signal and applying said sample to an output; and a plurality of sets of M shift registers each of which has a data input, a data output, and a clock input, the shift registers in each set being connected in series with each other with first shift register in each set having, its input connected to the output of a respective sample circuit to obtain data signal samples therefrom, the clock inputs of all of the shift registers in each set being coupled to each other and to one of said clock signals.

2. The sampling system of claim 1 wherein said clock divider generates N clock signals each of which have a frequency of $f_0/N$ where $f_0$ is the frequency of said master clock signal, said clock signals having respective phases that are equally spaced from each other so that said clock signals have respective phases of 360/X degrees, where X=1, 2, . . . N so that said sampling system samples said data signal at frequency of $f_0$ to obtain N*M samples of said data signal every (M/$f_0$) seconds.

3. The sampling system of claim 1 wherein said data signal is an analog signal and wherein said plurality of sample circuits are on analog sample circuits and said plurality of sets of M shift registers are analog shift registers.

4. The sampling system of claim 1 wherein said data signal is a digital signal varying between two logic levels.

5. The sampling system of claim 1 wherein said each sample circuit comprises:

a PMOS transistor having its gate connected to a first trigger signal generated from one of said clock signals;

an NMOS transistor having its source connected to the source of said PMOS transistor and to said data signal, its drain connected to the drain of said PMOS transistor; and its gate connected to a second trigger signal generated from the same clock signal from which said first trigger signal is generated;

a capacitor connected to the drains of said transistors, said capacitor storing a sample of said data signal responsive to said first and second trigger signals.

6. A system for displaying on a screen an image corresponding to a data signal said system comprising:

a matrix display having a plurality of row inputs and a plurality of column inputs;

a row processing and driving circuit connected to the row inputs of said matrix display;

a clock circuit generating a plurality of clock signals at respective outputs having phases that differ from each other;

a plurality of sample circuits each of which has a data input receiving said data signal and a clock input receiving a respective one of said clock signals, each of said sample circuits sampling said data signal responsive to its respective clock signal and applying said sample to an output;

a plurality of sets of M shift registers each of which has a data input, a data output, and a clock input, the shift registers in each set being connected in series with first shift register in each set having its input connected to the output of a respective sample circuit to obtain data signal samples therefrom, the clock inputs of all of the shift registers in each set being coupled to each other and to one of said clock signals; and a column processing and driving circuit having a plurality of column inputs receiving respective column signals corresponding to the intensity at which a pixel in said column is to be displayed, said column processing and driving circuit having said inputs connected to the outputs of respective shift registers and corresponding outputs connected to the column inputs of said display,
the inputs to said column processing and driving circuit being connected to the outputs of said shift registers in the same order as the samples stored in said shift registers were obtained.

7. The display system of claim 6 wherein said clock circuit generates N clock signals each of which have a frequency of $f_0/N$, said clock signals having respective phases that are equally spaced from each other so that said clock signals have respective phases of 360/X degrees, where X=1, 2, . . . N whereby said display system samples said data signal at a frequency of $f_0$ to obtain N*M samples of said data signal every (M/$f_0$) seconds.

8. The display system of claim 6 wherein said data signal is an analog signal, and wherein said plurality of sample circuits are an analog sample circuits and said shift registers are analog each shift registers.

9. The display system of claim 6 wherein said data signal is a digital signal varying between two logic levels.

10. The display system of claim 6 wherein said each sample circuit comprises:

a PMOS transistor having its gate connected to a first trigger signal generated from one of said clock signals;

an NMOS transistor having its source connected to the source of said PMOS transistor and to said data signal, its drain connected to the drain of said PMOS transistor; and its gate connected to a second trigger signal generated from the same clock signal from which said first trigger signal is generated;

a capacitor connected to the drains of said transistors, said capacitor storing a sample of said data signal responsive to said first and second trigger signals.

11. The display system of claim 6 wherein said matrix display is a field emission display.

12. The display system of claim 6 wherein said display contains N*M columns.

13. A system for sampling a data signal at a relatively high frequency using a clock having a relatively low frequency, said system comprising:

an oscillator generating a plurality of clock signals having said relatively low frequency, said clock signals having respective phases that differ from each other;

a sampling device receiving said data signal, said sampling device obtaining a respective sample of said data signal responsive to each of said clock signals at said relatively low frequency so that samples are obtained from all of said clock signals at said relatively high frequency; and a storage device coupled to said sampling device, said storage device receiving and saving the data signal samples obtained responsive to each clock signal in corresponding sets with the samples in each set being saved in the order in which said samples were obtained so that a set of time ordered samples are obtained corresponding to each at said clock signals.

14. The system of claim 13 wherein said oscillator generates N clock signals having respective phases that are equally spaced from each other so that said clock signals have respective phases of 360/X degrees where X=1, 2, . . . N, whereby said sampling device samples said data signal at a frequency of N*$f_0$ where $f_0$ is the frequency of saved relatively low frequency.

15. The system of claim 13 wherein said storage device saves M samples in each of said sets so that N*M samples of said data signal are obtained every (M/$f_0$) seconds.

16. The system of claim 13 wherein said storage device includes a plurality of shift registers.

17. The system of claim 13 wherein said sampling device is a sample and hold circuit.

18. A method of sampling a data signal at a relatively high frequency using a clock having a relatively low frequency, said method comprising:

generating a plurality of clock signals having said relatively low frequency, said clock signals having respective phases that differ from each other;

sampling said data signal responsive to each of said clock signals to obtain from each of said clock signals a respective sample at said relatively low frequency so that samples are obtained from all of said clock signals at said relatively high frequency; and saving the data signal samples obtained responsive to each clock signal in corresponding sets with the samples in each set being saved in the order in which said samples were obtained so that a set of time ordered samples are obtained corresponding to each at said clock signals.

19. The method of claim 18 wherein N clock signals are generated having respective phases that are equally spaced from each other so that said clock signals have respective phases of 360/X degrees where X=1, 2, ... N, whereby said data signal is sampled at a frequency of $N*f_o$ where $f_o$ is the frequency of said relatively low frequency.

20. The method of claim 18 wherein M samples are saved in each of said sets so that $N*M$ samples of said data signal are obtained every $(M/f_o)$ seconds.

* * * * *

UNITED STATES PATENT AND TRADEMARK OFFICE
CERTIFICATE OF CORRECTION

PATENT NO. : 5,894,235
DATED : April 13, 1999
INVENTOR(S) : David A. Zimlich

It is certified that error appears in the above-identified patent and that said Letters Patent is hereby corrected as shown below:

Column 1,
Line 8, add a new section after the section entitled
CROSS-REFERENCE TO RELATED APPLICATION:

-- STATEMENT AS TO GOVERMENTS RIGHTS

This invention was made with United States Governmetn support under Contract No. DABT63-93-C0025 awarded by the Advanced Research Projects Agency (ARPA). The United States Government has certain rights in this invention. --

Column 1,
Line 51, reads "100" should read -- $\phi$ --

Column 2,
Line 4, reads "$t_N\_1$" should read -- $t_{N-1}$ --
Line 6, reads "$_{t2}$" should read -- $t_2$ --

Column 4,
Line 9, reads "equaily" should read -- equally --
Line 19, reads "leading," should read -- leading --

Column 7,
Line 31, reads "230)" should read -- 230 --
Line 65, reads "log,ic" should read -- logic --

Column 8,
Line 2, reads "falling," should read -- falling --
Line 25, reads "111" should read -- 11 --

Column 9,
Line 4, reads "having," should read -- having --

UNITED STATES PATENT AND TRADEMARK OFFICE
CERTIFICATE OF CORRECTION

PATENT NO. : 5,894,235
DATED : April 13, 1999
INVENTOR(S) : David A. Zimlich

It is certified that error appears in the above-identified patent and that said Letters Patent is hereby corrected as shown below:

Column 10,
Line 62, reads "saved" should read -- said --

Signed and Sealed this

Nineteenth Day of March, 2002

Attest:

JAMES E. ROGAN
*Director of the United States Patent and Trademark Office*

*Attesting Officer*